US010249578B2

United States Patent
Campbell et al.

(10) Patent No.: US 10,249,578 B2
(45) Date of Patent: *Apr. 2, 2019

(54) CORE-SHELL PARTICLES FOR ANTI-TAMPERING APPLICATIONS

(71) Applicant: International Business Machines Corporation, Armonk, NY (US)

(72) Inventors: Eric J. Campbell, Rochester, MN (US); Sarah K. Czaplewski, Rochester, MN (US); Joseph Kuczynski, North Port, FL (US); Timothy J. Tofil, Rochester, MN (US); Jason T. Wertz, Pleasant Valley, NY (US); Jing Zhang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/816,768

(22) Filed: Nov. 17, 2017

(65) Prior Publication Data

US 2018/0166398 A1 Jun. 14, 2018

Related U.S. Application Data

(63) Continuation of application No. 15/377,924, filed on Dec. 13, 2016, now Pat. No. 9,859,226.

(51) Int. Cl.
*H03K 19/00* (2006.01)
*H01L 23/00* (2006.01)
(Continued)

(52) U.S. Cl.
CPC .............. *H01L 23/57* (2013.01); *H01L 23/06* (2013.01); *H01L 23/3107* (2013.01); *H01L 23/573* (2013.01)

(58) Field of Classification Search
CPC ...... H01L 23/57; H01L 23/06; H01L 23/3107
(Continued)

(56) References Cited

U.S. PATENT DOCUMENTS

| 5,881,155 A | 3/1999 | Rigal |
| 7,005,733 B2 | 2/2006 | Kommerling et al. |

(Continued)

FOREIGN PATENT DOCUMENTS

| WO | 2006013302 A1 | 2/2006 |
| WO | 2007018761 A2 | 2/2007 |
| WO | 201540056 A1 | 3/2015 |

OTHER PUBLICATIONS

List of IBM Patents or Applications Treated as Related.
(Continued)

*Primary Examiner* — Don Le
(74) *Attorney, Agent, or Firm* — Patterson + Sheridan, LLP

(57) ABSTRACT

Devices and methods for resisting or preventing physical tampering of electronic components are described. A tamper resistant apparatus comprises a tampering sensor having a surface at which a first and second conductive portion are disposed. A core-shell particle (or a plurality of particles) is disposed on the surface of the tampering sensor. The core-shell particle has a liquid metallic core and a shell surrounding the core. When tampering occurs, forces associated with the tampering cause the core-shell particle to rupture. The released metallic core material can form a conductive pathway between the first and second conductive portions of the tampering sensor. The tampering sensor triggers a security response when the first and second conductive portions are electrically connected to each other by the metallic material from the ruptured core-shell particle(s).

20 Claims, 6 Drawing Sheets

(51) Int. Cl.
*H01L 23/31* (2006.01)
*H01L 23/06* (2006.01)

(58) Field of Classification Search
USPC .............................................................. 326/8
See application file for complete search history.

(56) References Cited

U.S. PATENT DOCUMENTS

| | | | |
|---|---|---|---|
| 7,015,823 B1* | 3/2006 | Gillen | G08B 13/128 |
| | | | 340/541 |
| 7,045,730 B2 | 5/2006 | Hollar et al. | |
| 7,898,090 B1 | 3/2011 | Eaton | |
| 8,088,486 B2 | 1/2012 | Toyoda et al. | |
| 8,099,783 B2 | 1/2012 | Melton | |
| 8,268,668 B1 | 9/2012 | Pham et al. | |
| 8,330,131 B2 | 12/2012 | Ceglio et al. | |
| 8,330,191 B2 | 12/2012 | Hoofman et al. | |
| 8,502,396 B2 | 8/2013 | Buer et al. | |
| 8,816,717 B2 | 8/2014 | Fritz et al. | |
| 8,976,010 B2 | 3/2015 | Pagani et al. | |
| 9,576,451 B2 | 2/2017 | Edmonds | |
| 9,697,380 B2 | 7/2017 | Doyle et al. | |
| 9,740,888 B1* | 8/2017 | Aga | G06F 21/86 |
| 2008/0106605 A1* | 5/2008 | Schrijen | G06F 21/60 |
| | | | 348/207.99 |
| 2008/0223936 A1* | 9/2008 | Mickle | B65D 75/327 |
| | | | 235/492 |
| 2008/0278353 A1* | 11/2008 | Smith | G06F 3/0202 |
| | | | 341/22 |
| 2017/0171964 A1 | 6/2017 | Arvin et al. | |

OTHER PUBLICATIONS

Simge Cinar et al., "Mechanical Fracturing of Core-Shell Undercooled Metal Particles for Heat-Free Soldering", Scientific Reports, Feb. 23, 2016, pp. 1-10.
Yuan Meng et al., "Shape Actuation via Internal Stress-Induced Crystallization of Dual-Cure Networks", ACS Macro Letters, ACS Publications, American Chemical Society, 2015, pp. 115-118.
U.S. Appl. No. 15/377,924 entitled "Core-Shell Particles for Anti-Tampering Applications,", as filed on Dec. 13, 2016.

* cited by examiner

CORE-SHELL PARTICLES FOR ANTI-TAMPERING APPLICATIONS

CROSS-REFERENCE TO RELATED APPLICATIONS

This application is a continuation of co-pending U.S. patent application Ser. No. 15/377,924, filed Dec. 13, 2016. The aforementioned related patent application is herein incorporated by reference in its entirety.

BACKGROUND

The present disclosure concerns physical security of electronic components, and more specifically applications related to prevention or monitoring of physical tampering of electronic components.

Computing systems include electronic components such as security devices and cryptographic modules to prevent data theft and the like. These devices and modules provide data security in personal computing systems and high-end network servers. These devices and modules are, for example, implemented as a device card or on a printed circuit board. To meet industry accepted standards for protection, these devices and modules must incorporate features and mechanisms that provide physical security for internal device components such that physical attempts to access or tap internal components can be detected and/or responded to in a manner that resists tampering and/or unauthorized access of data

SUMMARY

According to an embodiment of the present disclosure, a tamper resistant apparatus comprises a tampering sensor having a first surface at which a first conductive portion and a second conductive portion are disposed, and a core-shell particle having a liquid metallic core and disposed on the first surface of the tampering sensor. The core-shell particle has a liquid metallic core and a shell surrounding the liquid metallic core. The tampering sensor is configured to trigger a security response when the first conductive portion and the second conductive portion are electrically connected to each other.

According to another embodiment of the present disclosure, a secured device comprises an electronic component, a tampering sensor connected to the electronic component and having a first surface at a first and a second conductive portion are disposed, a casing surrounding the electronic component and the tampering sensor, and a core-shell particle disposed on the first surface of the tampering sensor, wherein the core-shell particle has a liquid metallic core and a shell surrounding the liquid metallic core, and the tampering sensor is configured to trigger a security response when the first conductive portion and the second conductive portion are electrically connected to each other.

DETAILED DESCRIPTION

Security devices, such as encryption modules, that are resistant to physical tampering are required in various computing systems to protect sensitive data and components. For example, stored data that might be effectively invulnerable to unauthorized access via software protocols might be relatively easily accessed by direct, physical means, even if the stored data is notionally protected by encryption. Such physical access might entail drilling through or grinding of portions of an outer casing or packaging of an electronic component. Physical access to internal device components might allow various data protective features to be overridden or avoided such that otherwise protected data could be accessed for analysis or manipulation.

For example, a security device might include various sensor elements (temperature, motion, electrical) to detect physical tampering actions and to trigger an alarm or other security response when tampering actions are detected. In such instances, a security response could include shutting down power to an electronic device, erasing and/or overwriting data stored on the electronic device. In some examples, the security device can be integrated in a single package with an electronic component, such as solid state storage device or could be a separate component included in an enclosed or encased electronic module.

The present disclosure describes an example of a security device incorporating particles that comprise a metallic material that is in a liquid or flowable state. These particles are adapted to rupture in response to physical tampering efforts, such as drilling or probing of an encased or encapsulated electronic component. When these particles rupture, the metallic material can flow to complete or otherwise alter the state of a monitoring circuit, or the like, such that the monitoring circuit can provide or otherwise trigger a security response for the security device.

Figure 1:
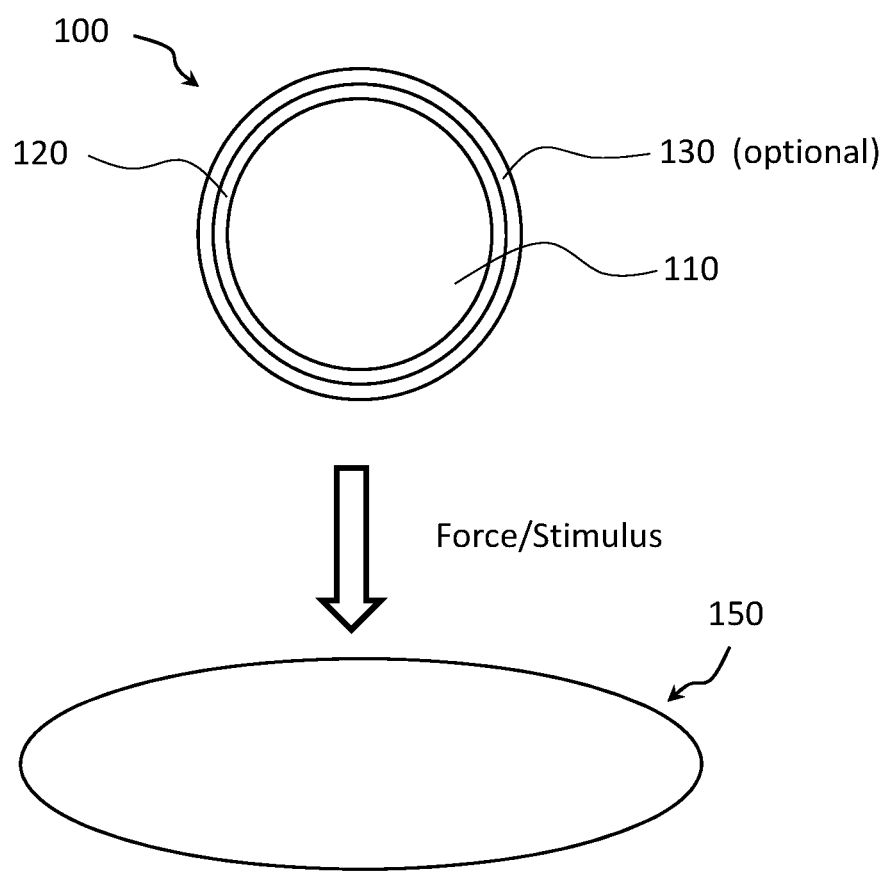
FIG. 1 depicts aspects of a core-shell liquid metallic particle.

FIG. 1 is a cross-sectional depiction of a particle 100 that can be used in a security device of an embodiment. The particle 100 may be referred to as a core-shell particle in some instances. The particle 100 is an intact core-shell liquid metallic particle. The particle 100 may be referred to as a core-shell undercooled metal particle when the liquid metallic material of the particle 100 is a material having a nominal freezing point temperature higher than an expected, or current, operating temperature of the security device. Here, particle 100 is depicted as a sphere or spheroid body, but actual particle shapes may be varied. Particle 100 includes a core 110, a shell 120 surrounding the core 110, and, optionally, a coating 130 on the outer surface of the shell 120. Core 110 can be a liquid metallic material. Shell 120 is a solid material such as, for example, an oxide of a metal found in core 110. Shell 120 can be a passivating layer formed by surface oxidation of a material of core 110. Coating 130 can be an organic layer that may help stabilize shell 120 and/or maintain integrity of particle 100. Coating 130 may also be adapted to improve compatibly of particle 100 with surrounding materials, such as a resin material. As noted, coating 130 is optional.

Dimensions and relative ratios of dimensions for the sub-portions of particle 100 depicted in FIG. 1 are not necessarily to scale or correct for an actual particle 100 and have been selected for purposes of explaining the arrangement of the various sub-portions of particle 100 rather than dimensional correctness. In general, a particle 100 may be a nanoscale (~$10^{-9}$ m) to microscale (~$10^{-6}$ m) particle.

In some embodiments, where a particle 100 is generally spheroid, an outer diameter may be in a range of a few nanometers (nm) to several microns (μm). For example, a particle 100 may have an outer diameter in a range of about 5 nm to about 50 μm. The thickness of shell 120 may depend on the material(s) of core 110 and the conditions used in fabricating particle 100. Coating 130, when present, may comprise a monolayer or greater of an organic molecule, which may be bonded to the shell 120 by chelation-type or other bonding. In some instances, coating 130 may be referred to as chemisorbed on shell 120. In some embodiments, the coating 130 can comprise acetate ($C_2H_3O_2^-$) anions or similar molecules adhered to shell 120 by chelation.

Various techniques can be adopted for preparation of particles 100. As an example, a droplet emulsion technique can be used to produce particles 100 from molten or liquid metals. In a particular example, Field's metal may be used in a droplet emulsion technique to produce undercooled core-shell particles 100. Field's metal is a eutectic alloy of bismuth (Bi), indium (In), and tin (Sn) that becomes liquid at ~45-60° C. Other metals and alloys may be adopted including various bismuth-tin alloys and gallium-indium alloys known in the art as fusible alloys. Various alloys including bismuth (Bi), cadmium (Cd), gallium (Ga), indium (In), lead (Pb), and/or tin (Sb) as components may be adopted. Gallium (Ga) and mercury (Hg) are low melting point metals which can also be used (either alone, or in alloys with other elements) in particles 100.

In some examples, particles 100 can be produced by applying a SLICE (shearing liquids into complex particles) technique as disclosed in "Mechanical Fracturing of Core-Shell Undercooled Metal Particles for Heat-Free Soldering" Çinar, S. et al, Sci. Rep. 6, 21864 (2016), the entire contents of which is incorporated herein by reference. In general, the SLICE technique involves applying shear forces (e.g., by rotational processing) to a liquid or a molten metal to form small droplets/particles in a carrier solution. The carrier solution may be adopted to promote surface oxidation of the molten/liquid metal so as promote formation of shell 120 by oxidization of the molten/liquid metal ultimately forming core 110. An acid solution, for example a solution of acetic acid, may be used to oxidize the surface of the metal droplets. In this context, "undercooled" refers to a material that is in a liquid state at a temperature below the material's normal melting point. An undercooled liquid is a thermodynamically metastable material and is thus prone to transition to a more thermodynamically favorable state upon a triggering event. To form core-shell particles of undercooled metal, the carrier solution is maintained at a temperature above the melting point of the metal during dispersion into droplets, and then heat is removed while continuing fluidic shear until the solution reaches room temperature.

The SLICE process can produce undercooled core-shell particles in which the material of core 110 remains a liquid substantially below its normal freezing point. It is considered that a continuous, internally smooth shell 120 which might form around the liquid material of core 110 lacks nucleation sites or crystallization seeding/catalysis points which might induce freezing/solidification of the core material. Thus, absent some external stimulus/event, the material in core 110 can continue in a metastable liquid condition indefinitely or at least for extended period of times.

This process or similar ones can also be used with materials that are liquid at expected processing and operation conditions. That is, the liquid material of core 110 need not be an undercooled liquid in all examples. In some instances, particles 100 may be referred to as "liquid marbles" and likewise may be fabricated according to processes and techniques known in the art for making liquid marbles.

As depicted in FIG. 1, the rupturing of shell 120 results in formation of ruptured particle 150. Ruptured particle 150 is the result of the release and flow of material of core 110. The remnants of shell 120 (and coating 130) are not specifically depicted in conjunction with ruptured particle 150, but may still be present in, or in association with, ruptured particle 150. Rupturing of shell 120 may result from an external stimulus or force, such as might be associated with a tampering event.

In examples where core 110 is an undercooled metallic liquid, the remnants of ruptured shell 120 may act as nucleation or catalyzing points to cause the solidification of the undercooled liquid from core 110. In other embodiments, core 110 is a low melting point metal such as gallium or gallium alloys and the ambient conditions of ruptured particle remain above the melting point of the core 110 material, the exposure of the core 110 material to surrounding elements or conditions may cause the liquid metal to fuse with surrounding elements to form a solid, though this is not necessarily required in all embodiments.

Here, as depicted in FIG. 1, the initially flowable material released by rupturing of shell 120 solidifies once released from the core 110 and brought into contact with nucleation sites.

Figure 2:
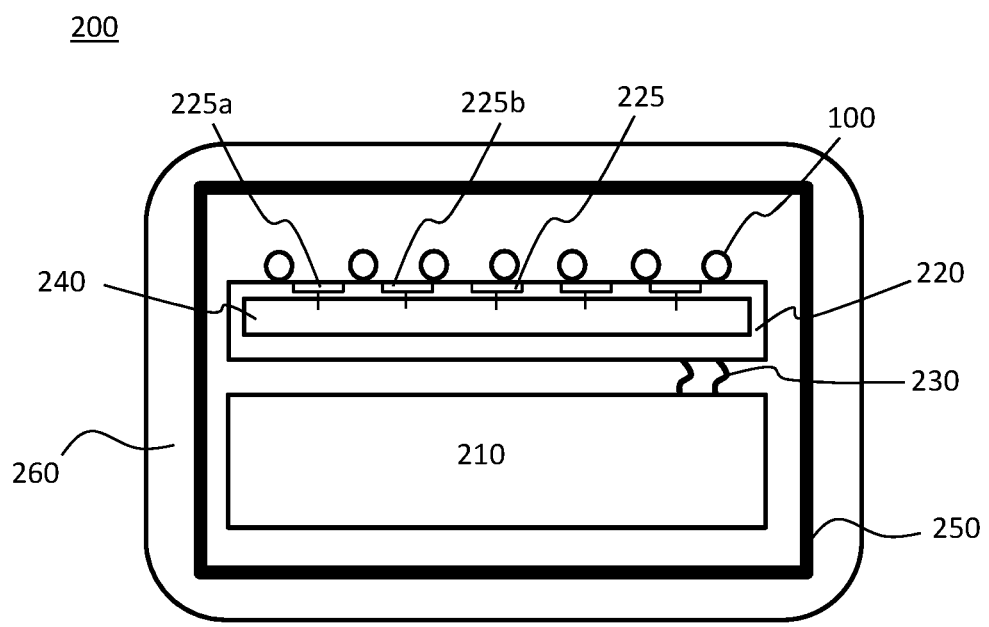
FIG. 2 depicts aspects of a secured device of a first example

FIG. 2 depicts aspects of a security device 200 of a first example that incorporates particles 100. FIG. 2 may be considered a schematic cross-sectional representation of security device 200. Security device 200 includes an internal component 210 connected to a tampering sensor 220. Tampering sensor 220 includes a plurality of conductive portions 225 including at least first conductive portion 225a and second conductive portion 225b, which in an initial state are separated from each other. The particles 100 are disposed on the tampering sensor 220 at a density at which adjacent conductive portions 225 remain electrically separated from each other. That is, the particles 100 do not provide an electrical pathway between the adjacent conductive portions 225. A monitor circuit 240 is connected to the conductive portions 225 to monitor or detect changes in the electrical connectivity between adjacent conductive portions 225. For example, if a tampering event causes one or more particles 100 to rupture and form an electrical pathway between the first conductive portion 225a and the second conductive portion 225b, the monitor circuit 240 may detect this change in electrical connectivity as a change in current, voltage, or resistance in the network comprising the conductive portions 225 (or a subset thereof). In this example, security device 200 includes a casing 250 which surrounds the internal component 210 and the tampering sensor 220. The casing 250 may be optional in some embodiments. Security device 200 may also optionally include an encasing resin 260 surrounding its outer periphery or portions thereof. Possible materials for encasing resin 260 include epoxy resins, silicone resins, or other curable materials.

The security device 200 may be, without limitation, a circuit board, a packaged integrated circuit, a microchip, a microprocessor, an electronic card device, a cartridge device, a cryptographic module, or combinations of these elements. The internal component 210 may be, without limitation, a circuit board, an integrated circuit, a packaged integrated circuit, a microchip, a microprocessor, an electronic card device, a cartridge device, a cryptographic module, a solid-state memory device, a hard disk drive, or combinations of these elements. Internal component 210 may also include a power source such as a battery or the like. Additionally, while a single internal component 210 is depicted in the security device 200 of FIG. 2, a plurality of internal components 210 may be provided. Similarly, a plurality of tampering sensors 220 may be included in security device 200. For example, a separate tampering sensor 220 might be provided between the internal component 210 and each outer surface of security device 200 that might be exposed to possible tampering.

Casing 250 is depicted in FIG. 2 as completely encasing or surrounding internal component 210 and tampering sensor 220. While this arrangement might be preferred from the standpoint of overall physical security, various portions of the internal component 210 might be left uncovered as needed for mounting or connecting the secured device 200 within a computing system. For example, various terminals, leads, contacts, or wires might be left exposed by, or allowed to protrude from, casing 250.

In some examples, tampering sensor 220, or portions thereof, might be disposed outside of casing 250. Note also that tampering sensor 220 and internal component 210 are not required to be directly adjacent to each other in the manner depicted as an example in FIG. 2. Various other components, empty space, and/or structural elements may be interposed between these elements (i.e., tampering sensor 220 and internal component 210).

In FIG. 2, monitor circuit 240 is depicted as a part of tampering sensor 220. This is one possible embodiment, but in other embodiments monitor circuit 240 may be a distinct component outside of tampering sensor 240 or even a sub-part of internal component 210.

Tampering sensor 220 is depicted in FIG. 2 as being connected to internal component 210 by leads 230. In general, in this example embodiment, leads 230 carry an electrical signal to the internal component 210. The electrical signal in this example is supplied by monitor circuit 240. However, it is not required in all embodiments for tampering sensor 220 to be connected to internal component 210 in this manner. For example, the tampering sensor 220 might be directly mounted or soldered to the internal component 210. In some examples, tampering sensor 220 might itself be an integral portion of component 210 without inclusion of distinct leads 230. It is also not required that the signal supplied from the tampering sensor 220 be electrical. For example, tampering sensor 220 could include components which might convert an electrical signal into an optical or other type signal for transmission by optical fiber or other means. Similarly, a signal output from tampering sensor 220 may be supplied to a plurality of internal components 210, when such are present. The signal output from tampering sensor 220 may also be supplied to external systems, components, or devices in addition to, or instead of, being supplied to internal component 210. Tampering sensor 220 may also include circuitry or components which perform and/or initiate particular security responses when tampering events are detected. For example, tampering sensor 220 might include a switch or the like to shut off an external power supply of internal component 210 and thereby cause an operational shutdown.

Tampering sensor 220 is used to detect stimuli associated with a tampering event and to trigger a security response. In this context, a "security response" includes any action or operation to prevent or limit access to internal component 210, and without limitation, may include: shutdown of the internal component 210 or a portion thereof, transmitting an alarm signal to an internal component 210, transmitting an alarm signal to an external component (e.g., outside of casing 250), sounding an audible alarm, triggering a visual alarm, rendering an internal component 210 inoperable, physical destruction of an internal component 210 or a portion thereof, erasure of electronically stored data, encrypting internal data, overwriting stored data with dummy data, or the like.

Monitor circuit 240 is electrically connected to each of the conductive portions 225; however, the connection need not be direct to each conductive portion. For example, in some embodiments, the conductive portions 225 may be connected to each other in a network (rather than electrically isolated from each other as depicted in FIG. 2) and the monitor circuit 240 may detect tampering according to changes from the normal (initial) electrical resistance present in the network or other characteristics. In other examples, the conductive portions 225 may be electrically isolated from each other in an initial state and monitoring circuit 240 may detect tampering according to presence or absence of any electrical connection between conductive portions 225. Monitor circuit 240 may incorporate a voltmeter, an ammeter, an ohmmeter, or the like. Monitor circuit 240 may include a microcontroller unit (MCU), a signal processing unit, central processing unit, or the like.

Figure 3A:
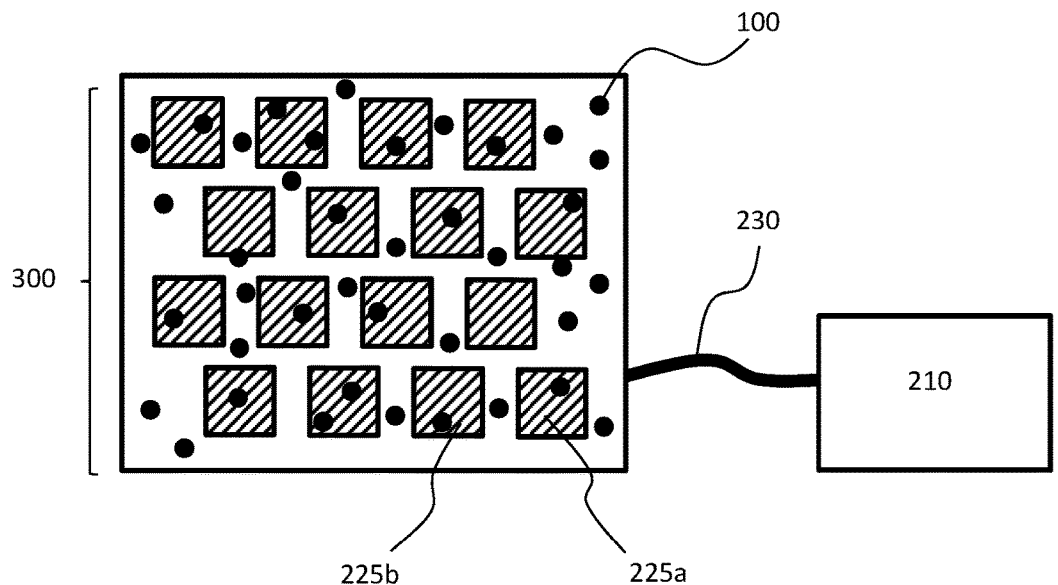
FIG. 3A depicts aspects of a tampering sensor in a first state.
Figure 3B:
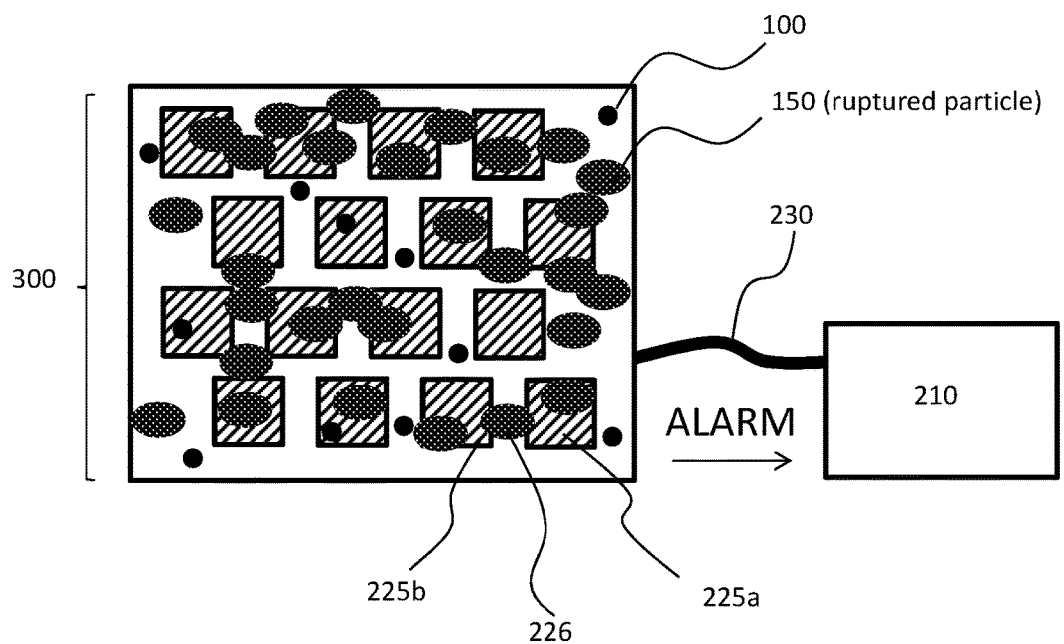
FIG. 3B depicts aspects of the tampering sensor in a second state.

FIG. 3A depicts aspects of a tampering sensor 220 in a first state. FIG. 3B depicts aspects of the tampering sensor 220 in a second state. Here, the first state corresponds to an initial state before the occurrence of a tampering event. The second state corresponds to a state subsequent to a tampering event.

The tampering sensor 220 includes a conductive portion pattern 300 comprising a plurality of conductive portions 225, including first conductive portion 225a and second conductive portion 225b. A plurality of particles 100 are disposed on the conductive portion pattern 300 in the initial state depicted in FIG. 3A. In this particular example, the conductive portions 225 are square pads disposed in an offset arrangement at a surface of tampering sensor 220. In general, the shape and disposition of conductive portions 225 at the surface of tampering sensor 220 may be arbitrarily selected. That is, conductive portions 225 may have any planar shape, which may be regular or irregular. The conductive portions 225 are also not required to have the same shape as each other. The conductive portions 225 may be disposed in various patterns and/or arrays. The conductive portions 225 maybe formed in a line-space array in some examples. In general, the spacing between adjacent conductive portions 225 (e.g., conductive portions 225a and 225b) may be set in accordance with the loading and size of particles 100. The spacing between adjacent conductive portions 225 need not be constant across the surface of tampering sensor 220, but may, for example, be varied according to expected disposition of particles 100 and/or expected locations and/or types of tampering events.

As depicted in FIG. 3A, the conductive portions 225 are electrically isolated from each other in the initial state. However, in some examples, as discussed above, the conductive portions 225 may be connected in an electrical network and tampering events may be detected by changes in characteristics of the network.

The particles 100 are supplied on the conductive portion pattern 300 at a density less than that at which unruptured particles 100 would be statistically likely to provide continuous connections between adjacent conductive portions 225, but at or greater than the density at which ruptured particles 150 will be statistically likely to provide continuous connections between adjacent conductive portions. The particles 100 may be applied to the conductive portion pattern 300 by various means, such as spin casting, potting, inkjet printing, screen printing, knife coating, dip coating, spray coating or the like. The particles 100 may supplied from a carrier solution which substantially evaporates after application. In some embodiments, particles 100 may be dispersed within a polymeric resin which is disposed over the conductive portion pattern 300.

When the security device 200 is tampered with, shear forces associated with the tampering rupture at least some of the particles 100. The liquid material from core 110 then disperses outwardly and ruptured particles 150 are formed. The ruptured particles 150 form conductive pathways between adjacent conductive portions 225 (e.g., first conductive portion 225a and second conductive portions 225b). Tampering may include attempts to cut, puncture, abrade, or drill, a portion of the outer periphery of security device 200 (e.g., casing 250 and/or encasing resin 260). Tampering events involving substantial heating (e.g., burning) or cooling (e.g., exposure to liquid nitrogen) may also produce forces sufficient to cause particles 100 to rupture FIG. 3B depicts the security device 200 after a tampering event has occurred. Various particles 100 have ruptured (forming ruptured particles 150) to form an electrical connection between at least some adjacent conductive portions 225 in the conductive portion pattern 300. It is not required that all or even a majority of particles 100 rupture in response to the tampering event. In particular, FIG. 3B shows a single ruptured particle 150 forming an electrical connection (pathway) 226 between first conductive portion 225a and second conductive portion 225b. In some embodiments, a single ruptured particle 150 may be sufficient to form a connection between adjacent conductive portions, but this is not a requirement and in other examples the electrical pathway between adjacent conductive portions may be formed with two or more rupture particles 150 which have flowed together. After connection between first conductive portion 225a and second conductive portion 225b has occurred, the tampering sensor 220 triggers a security response as described above. FIG. 3B depicts the security response in this instance as transmission of an alarm signal ("ALARM" in FIG. 3B) to internal component 210 along a lead 230.

Figure 4:
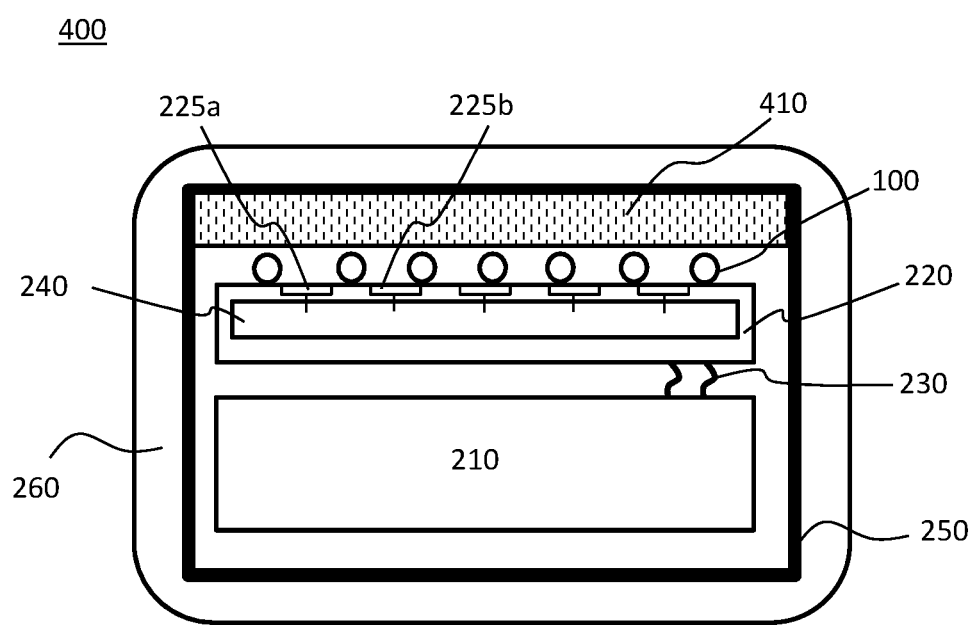
FIG. 4 depicts aspects of a secured device of a second example.

FIG. 4 depicts aspects of a security device of a second example. In FIG. 4, a security device 400 incorporates a tamper-sensitive resin material 410 for responding to tampering events in an amplified manner to cause additional shearing particles 100 and/or dispersion of the flowable material from core 110 upon rupture. The security device 400 is otherwise similar to security device 200.

The tamper-sensitive resin material 410 can be incorporated as a discrete layer disposed on casing 250, as depicted in FIG. 4, or the tamper-sensitive resin material can form casing 250. Alternatively, encasing resin 260 can comprise the tamper-sensitive resin material 410. In some examples, tamper-sensitive resin material 410 may be a shape-memory polymeric material (SMP) which is selected and applied such that it will change shape and apply force(s) to the particles 100 when a temperature change or other stimulus that might be associated with a tampering event occurs, rupturing the shell of the particles 100 by compression or shear and dispersing the flowable material from the particles 100.

A variety of SMPs are known in the art, for example, linear block copolymers of polyurethane and polyetheresters with physical crosslinks, block copolymers of polyethylene terephthalate and polyethylene oxide, block copolymers of polystyrene and poly(1,4-butadiene), which may be adopted as a tamper-sensitive resin. Various SMP materials which are triggered by a stimulus other than temperature change may be used as tamper-sensitive resin material. For example, SMPs triggered by ionizing radiation are known, as are light-sensitive SMPs incorporating photoresponsive switches.

Figure 5:
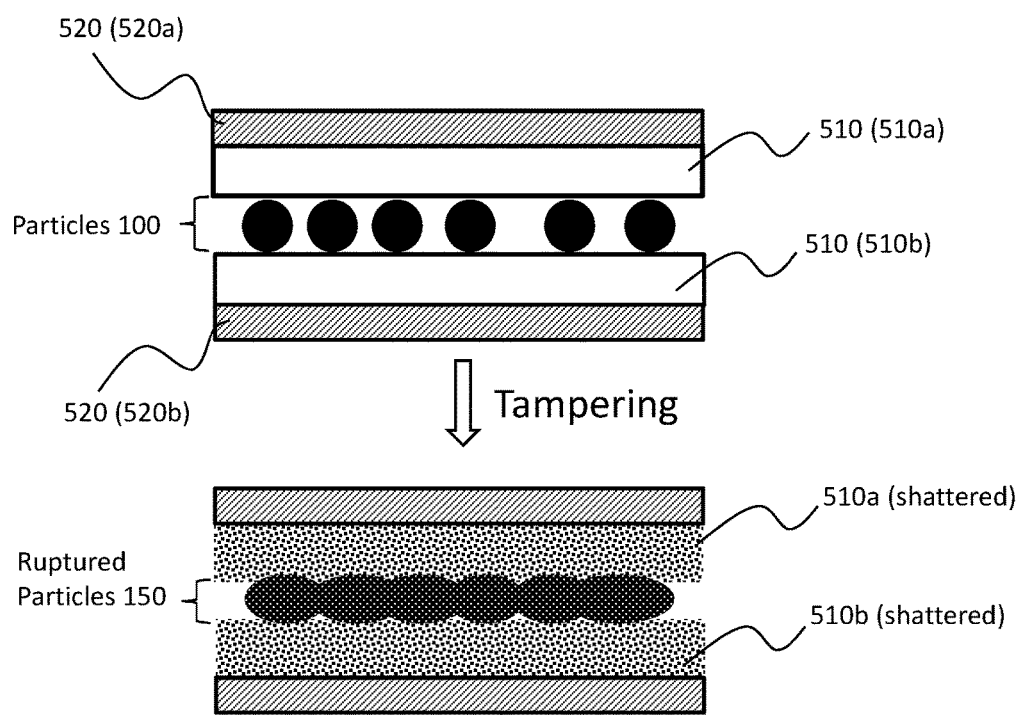
FIG. 5 depicts aspects of a secured device of a third example.

FIG. 5 depicts aspects of a security device of a third example. In FIG. 5, a security device incorporates particles 100 adjacent to a layer of tamper-sensitive glass 510. The security device of FIG. 5 is otherwise similar to security device 200, though for sake of explanatory clarity various elements depicted in FIG. 2 have been omitted in the depiction of FIG. 5. In the particular example of FIG. 5, two layers of tamper-sensitive glass are depicted and the particles 100 are disposed in between the two layers. The upper layer of tamper-sensitive glass may be referred to as tamper-sensitive glass 510a. The lower layer of tamper-sensitive glass may be referred to as tamper-sensitive glass 510b. Tamper-sensitive glass 510 may be, for example, be a glass with high internal tensile stress that will shatter in response to forces associated with tampering events.

In this example, a resin backing layer 520 is supplied on backside of the tamper-sensitive glass 510. This resin backing layer 520 is optional in some examples and may be provided to aid in the positioning and handling of the tamper-sensitive glass 510, which in some examples may be relatively thin and/or fragile. The resin backing layer 520 on tamper-sensitive glass 510a may be referred to as upper resin backing layer 520a. The resin backing layer 520 on tamper-sensitive glass 510b may be referred to as lower resin backing layer 520b.

In this third example, the tamper-sensitive glass 510 acts to extend a relatively localized force or stimulus that might be associated with tampering to other areas of the security device. Thus, the inclusion of tamper-sensitive glass 510 may be considered to spatially amplify the localized forces of a tampering event to rupture particles 100 outside the tampering event area. For example, the tamper-sensitive glass 510 can be selected so that a drilling attempt in one area of the security device causes a layer of tamper-sensitive glass 510 to completely shatter (thus causing the rupture of particles 100 over larger area than the drill site). The security device depicted in FIG. 5 may be referred to as a tamper resistant apparatus including a first (upper) tamper-sensitive glass layer 510 adjacent to the tampering sensor 220. The particles 100 (core-shell particles) are between the first tamper-sensitive glass layer 510 and the surface of the tampering sensor 220. In some examples, a security device may have a tampering sensor 220 that includes a tamper-sensitive glass layer (e.g., layer 510b). In such instances, the core-shell particle (e.g., particle 100) can be between the upper tamper-sensitive glass layer and the lower tamper-sensitive glass layer. The conductive portion pattern 300 may be formed on the upper surface of the lower tamper-sensitive glass layer (510b) in some examples.

In some embodiments, a conductive portion pattern 300 may be formed one or both of tamper-sensitive glass 510a or 510b. In other embodiments, only one layer of tamper-sensitive glass 510 might be incorporated, and the conductive portion pattern 300 might be disposed on a printed circuit board substrate of the tamper sensor 220, for example. In any event, tampering efforts cause the tamper-sensitive glass 510 to shatter and this shattering in turn ruptures the particles 100 (forming ruptured particles 150), which permits the core 110 material to flow and provide conductive pathways between adjacent conductive portions 225 (not specifically depicted in FIG. 5, see FIG. 2), which causes tampering sensor 220 to trigger a security response.

The ruptured particles 150 are depicted in FIG. 5 as a largely undifferentiated mass/layer rather than discrete particles because upon rupturing, the liquid from the various cores 110 has flowed together prior to solidification (solidification is depicted in this instance by the change in fill patterning of the core 110 material). As noted above, it is not required that all particles 100 rupture, or that all ruptured particles 150 flow into a single mass.

The security response in this instance may be transmission of an alarm signal ("ALARM") from tampering sensor 220; however, the security response is not limited to this and may correspond to any or all of the security responses described above.

Figure 6:
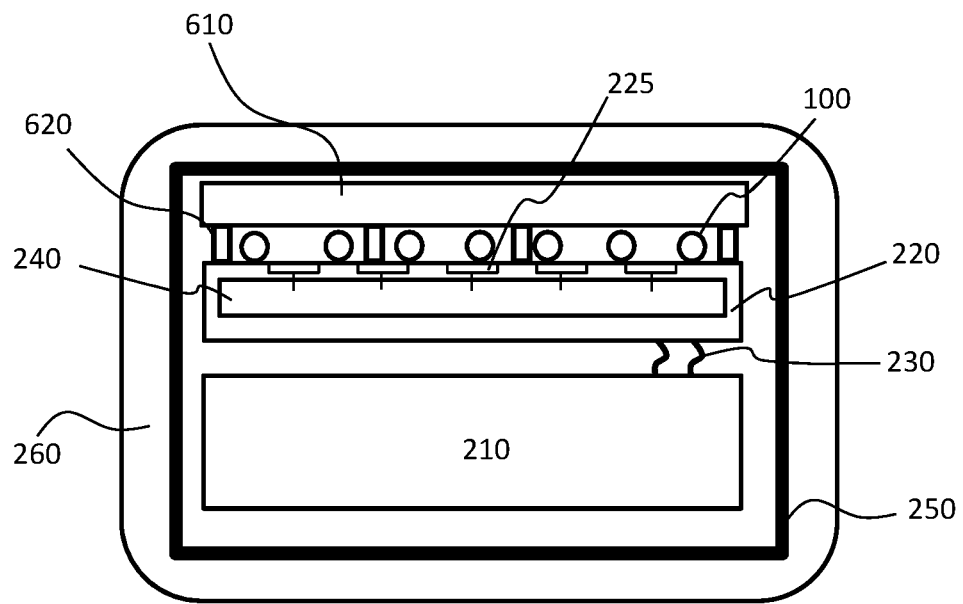
FIG. 6 depicts a modification of the first example incorporating a force spreading layer.

FIG. 6 depicts a modification of the first example, which furthermore may be incorporated into second and third examples (or any other embodiment). In this modification a force spreading layer 610 and standoffs 620 are incorporated into the security device 200. Force spreading layer 610 may be a solid sheet of material, which may be electrically conductive or an insulator material. The force spreading layer 610 can be supported above the particles 100 by standoffs 620. The standoffs 620 have a height from the surface of the conductive portion pattern 300 that is greater than the expected height/diameter of the particles 100. The standoffs 620 may serve to prevent pre-rupturing of the particles 100. The standoffs 620 can be selected so as to respond in some manner to forces associated with tampering events. For example, the standoffs 620 could be formed of a fragile or fracturable material that breaks or fractures in response to stimuli associated with tampering. For example, standoffs 620 could be formed of a material similar to that described in conjunction with tamper-sensitive glass 510. Standoffs 620 might also, or instead, be established as structurally unstable (as compared to materially unstable/fracturable) supports that might, for example, tip over, collapse, break, retract, or split when exposed to forces associated with tampering. When one or more standoff 620 tips/breaks/fractures, the force spreading layer 610 will no longer be prevented from contacting and rupturing the particles 100 over at least some portion of the surface of the tampering sensor 220. The rupturing of particles 100 triggers a security response as in the previous examples. Additional layers, such as encasing resin 260 and/or tamper-sensitive resin material 410 may be disposed on or over the force spreading layer 610. The number and positioning of standoffs 620 is arbitrary and may be selected in consideration of expected tampering forces and other design considerations.

Method for Resisting Tampering

A method for preventing or resisting tampering upon an electronic device comprising obtaining a secured device including an electronic component and a tampering sensor that is connected to the electronic component. The tampering sensor has a first surface at which a first conductive portion and a second conductive portion are disposed. A casing surrounds the electronic component and the tampering sensor. A core-shell particle having a liquid metallic core (or a plurality of such particles) is disposed on the first surface of the tampering sensor. The core-shell particle has a shell surrounding the liquid metallic core. The tampering sensor is configured to supply a signal when the first conductive portion and the second conductive portion are electrically connected to each other, such as occurs when the core-shell particle ruptures and material from the core flows along the first surface, for example. By monitoring the signal output by the tampering sensor a security response can be triggered according to the signal output by the tampering sensor. That is, when tampering ruptures the core-shell particle and the conductive portions become electrically connected as a consequence, the tampering sensor outputs a signal, alarm, or provides other indicators of a change in connectivity state of the conductive portions which can be used to trigger a security response, such as an erasure of electronic data stored by the electronic component, for example.

Obtaining a secured device may include fabricating/manufacturing the secured device or purchasing or otherwise acquiring access to the secured device. Monitoring in this context may include continuous or periodic active measurement or evaluation of current or voltage levels output from the tampering sensor, but passive monitoring may also be adopted such that changes in signal state from the tampering sensor might trigger or otherwise initiate actions of other components, such as a monitor circuit or the electronic component. In this context, a security response is as described above and may include, without limitation, activating an alarm, transmitting a message, powering down one or more electronic components, erasing stored data, overwriting stored data with dummy data, triggering destruction of one or more electronic components. In a particular example, the electronic component is a solid-state storage device or card including non-volatile storage elements such as, for example, static random-access memory (SRAM) components, and the security response comprises erasing of data stored in the solid-state storage device.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a tamper resistant apparatus, comprising:
   disposing a core-shell particle on a first surface of a tampering sensor, the first surface including a first conductive portion and a second conductive portion spaced from each other, wherein
   the core-shell particle has a liquid metallic core and a shell surrounding the liquid metallic core, and
   the tampering sensor is configured to trigger a security response when the first conductive portion and the second conductive portion are electrically connected to each other.

2. The method of claim 1, wherein the shell is an oxide formed of a metal of the liquid metallic core.

3. The method of claim 2, wherein the liquid metallic core has a freezing point higher than at an operating temperature of the tampering sensor.

4. The method of claim 2, wherein the liquid metallic core has a freezing point less than or equal to an operating temperature of the tampering sensor.

5. The method of claim 1, wherein the core-shell particle is formed by a SLICE technique.

6. The method of claim 1, further comprising:
connecting the tampering sensor to an electronic component to be protected from tampering; and
encasing the tampering sensor and the electronic component together within a casing.

7. The method of claim 6, wherein the security response comprises erasure of data stored in the electronic component.

8. The method of claim 1, wherein the security response comprises transmission of an alarm signal.

9. The method of claim 1, further comprising:
forming a tamper-sensitive resin layer adjacent to the tampering sensor, wherein the core-shell particle is between the tamper-sensitive resin layer and the tampering sensor.

10. The method of claim 1, further comprising:
placing a first tamper-sensitive glass layer adjacent to the tampering sensor, wherein the core-shell particle is between the first tamper-sensitive glass layer and the surface of the tampering sensor.

11. The method of claim 10, further comprising:
placing a second tamper-sensitive glass layer adjacent to the tampering sensor, wherein the core-shell particle is between the first tamper-sensitive glass layer and the second tamper-sensitive glass layer.

12. The method of claim 1, further comprising:
disposing a standoff on the first surface of the tampering sensor, the standoff having a height from the first surface of the tampering sensor that is greater than a diameter of the core-shell particle; and
disposing a sheet layer on the standoff, wherein the standoff and the core-shell particle are between the sheet layer and the surface of the tampering sensor.

13. The method of claim 12, wherein the sheet layer includes an electrically conductive metal.

14. A method of securing an electronic component, comprising:
connecting a tampering sensor to an electronic component, the tampering sensor having a first surface at which a first conductive portion and a second conductive portion are disposed;
surrounding the electronic component and the tampering sensor with a casing; and
disposing a core-shell particle on the first surface of the tampering sensor, wherein the core-shell particle has a liquid metallic core and a shell surrounding the liquid metallic core, and
the tampering sensor is configured to trigger a security response when the first conductive portion and the second conductive portion are electrically connected to each other.

15. The method of claim 14, wherein
the shell is an oxide formed of a metal of the liquid metallic core; and
the liquid metallic core has a freezing point higher than an operating temperature of the secured device.

16. The method of claim 14, further comprising:
forming a tamper-sensitive resin layer adjacent to the tampering sensor, wherein the core-shell particle is between the tamper-sensitive resin layer and the first surface of the tampering sensor.

17. The method of claim 14, further comprising:
placing a first tamper-sensitive glass layer adjacent to the tampering sensor, wherein the core-shell particle is between the first tamper-sensitive glass layer and the first surface of the tampering sensor.

18. The method of claim 14, further comprising:
disposing a standoff on the first surface of the tampering sensor, the standoff having a height from the first surface of the tampering sensor that is greater than a diameter of the core-shell particle; and
disposing a sheet layer on the standoff, wherein the standoff and the core-shell particle are between the sheet layer and the first surface of the tampering sensor.

19. A method of tampering prevention, comprising:
fabricating a tampering sensor by disposing a core-shell particle on a first surface of the tampering sensor, the first surface including a first conductive portion and a second conductive portion spaced from each other, wherein the core-shell particle has a liquid metallic core and a shell surrounding the liquid metallic core, and the tampering sensor is configured to supply a signal when the first conductive portion and the second conductive portion are electrically connected to each other;
connecting the tampering sensor to an electronic component; and
connecting the tampering sensor to a monitoring system such that the signal output by the tampering sensor will be received by the monitoring system and a security response will be triggered according to the signal output by the tampering sensor.

20. The method of claim 19, wherein the security response comprises erasure of electronic data stored by the electronic component.

* * * * *